US010141441B2

United States Patent
Cheng et al.

(10) Patent No.: US 10,141,441 B2
(45) Date of Patent: Nov. 27, 2018

(54) VERTICAL TRANSISTOR WITH BACK BIAS AND REDUCED PARASITIC CAPACITANCE

(71) Applicant: INTERNATIONAL BUSINESS MACHINES CORPORATION, Armonk, NY (US)

(72) Inventors: Kangguo Cheng, Schenectady, NY (US); Xin Miao, Guilderland, NY (US); Peng Xu, Guilderland, NY (US); Chen Zhang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/811,830

(22) Filed: Nov. 14, 2017

(65) Prior Publication Data
US 2018/0286978 A1 Oct. 4, 2018

Related U.S. Application Data

(63) Continuation of application No. 15/477,355, filed on Apr. 3, 2017.

(51) Int. Cl.
*H01L 29/78* (2006.01)
*H01L 29/66* (2006.01)
(Continued)

(52) U.S. Cl.
CPC ...... *H01L 29/7827* (2013.01); *H01L 29/0603* (2013.01); *H01L 29/0847* (2013.01); *H01L 29/1037* (2013.01); *H01L 29/6653* (2013.01); *H01L 29/6656* (2013.01); *H01L 29/66484* (2013.01); *H01L 29/66545* (2013.01); *H01L 29/66666* (2013.01); *H01L 29/7831* (2013.01)

(58) Field of Classification Search
CPC ............ H01L 29/7827; H01L 29/0603; H01L 29/0847; H01L 29/1037; H01L 29/66484; H01L 29/6653; H01L 29/66545; H01L 29/6656; H01L 29/66666; H01L 29/7831
See application file for complete search history.

(56) References Cited

U.S. PATENT DOCUMENTS 9,041,095 B2 * 5/2015 Masuoka ............ H01L 29/7827
257/329

OTHER PUBLICATIONS

Kangguo Cheng, et al., "Vertical Transistor With Back Bias and Reduced Parasitic Capacitance", U.S. Appl. No. 15/477,355, filed Apr. 3, 2017.
(Continued)

*Primary Examiner* — Cheung Lee
*Assistant Examiner* — Stephen C Smith
(74) *Attorney, Agent, or Firm* — Cantor Colburn LLP; Vazken Alexanian

(57) ABSTRACT

A method of making a vertical transistor device includes forming a front gate and a back gate opposite a major surface of a substrate. The front gate and the back gate are symmetric and arranged on opposing sides of a channel between the front gate and the back gate. The channel extends from a drain to a source. The method includes disposing a mask to cover the front gate and removing the back gate. The method further includes replacing the back gate with a layer of insulator and another back gate stack. The another back gate stack only covers a junction between the channel and the source, and remaining portions of the back gate are the layer of insulator.

17 Claims, 10 Drawing Sheets

(51) Int. Cl.
*H01L 29/06* (2006.01)
*H01L 29/08* (2006.01)
*H01L 29/10* (2006.01)

(56) References Cited

OTHER PUBLICATIONS

List of IBM Patents or Patent Applications Treated as Related; (Appendix P), Filed Nov. 14, 2017; 2 pages.
Kangguo Cheng, et al., "Vertical Transistor With Back Bias and Reduced Parasitic Capacitance", U.S. Appl. No. 16/031,142, filed Jul. 10, 2018.
List of IBM Patents or Patent Applications Treated as Related; (Appendix P), Filed Jul. 11, 2018; 2 pages.

* cited by examiner

VERTICAL TRANSISTOR WITH BACK BIAS AND REDUCED PARASITIC CAPACITANCE

PRIORITY

This application is a continuation of and claims priority from U.S. patent application Ser. No. 15/477,355, filed on Apr. 3, 2017, entitled "VERTICAL TRANSISTOR WITH BACK BIAS AND REDUCED PARASITIC CAPACITANCE," the entire contents of which are incorporated herein by reference.

BACKGROUND

The present invention relates in general to complementary metal oxide semiconductor (CMOS) technology, and more specifically, to vertical transistors with back bias and reduced parasitic capacitance.

CMOS technology is used to construct integrated circuits such as microprocessors, microcontrollers, static random access memory (RAM) and other digital logic circuits. A basic component of CMOS designs is metal oxide semiconductor field effect transistors (MOSFETs). As MOSFETs are scaled to smaller dimensions, various designs and techniques are employed to improve device performance. Vertical transistors (VFET), in which source/drain regions are arranged on opposing ends of a vertical channel region, are attractive candidates for scaling to smaller dimensions.

SUMMARY

According to one or more embodiments of the invention, a method of making a vertical transistor device includes forming a front gate and a back gate opposite a major surface of a substrate. The front gate and the back gate are symmetric and arranged on opposing sides of a channel between the front gate and back gate. The channel extends from a drain to a source. The method includes disposing a mask to cover the front gate and removing the back gate. The method further includes replacing the back gate with a layer of insulator and another back gate stack. The another back gate stack only covers a junction between the channel and the source, and remaining portions of the back gate are the layer of insulator.

According to one or more embodiments, a method of making a vertical transistor device includes forming a front gate and a back gate on a substrate. The front gate and the back gate are symmetric and arranged on opposing sides of a channel between the front gate and the back gate, and the channel extends vertically from a drain to a source. A bottom spacer is arranged between the front gate and the drain and between the back gate and the drain. A top spacer is arranged between the front gate and the source and the back gate and the source. An interlevel dielectric (ILD) is deposited on the front gate and the back gate. The method further includes disposing a mask to cover the front gate and recessing the ILD to expose the back gate. The method further includes removing the back gate and a portion of the top spacer on the back gate. The method further includes depositing a layer of insulator in an opening where the back gate was removed. The method includes recessing the layer of insulator, and depositing a back gate stack on the layer of insulator. The method further includes recessing the back gate stack such that the back gate stack extends from the layer of insulator to the top spacer.

According to one or more embodiments, a vertical transistor device includes a drain arranged on a substrate and a channel extending vertically from the drain to a source. The device includes a front gate stack arranged on one side of the channel. The front gate stack contacts the source, the channel, and the drain. The device further includes a back gate stack arranged on an opposite side of the channel. The back gate stack is arranged on an insulator layer and has a thickness that is smaller than a thickness of the front gate stack.

BRIEF DESCRIPTION OF THE DRAWINGS

The subject matter which is regarded as embodiments of the invention is particularly pointed out and distinctly claimed in the claims at the conclusion of the specification. The foregoing and other advantages of the embodiments of the invention are apparent from the following detailed description taken in conjunction with the accompanying drawings in which:

FIGS. 2-10 illustrate exemplary methods of making vertical transistors according to one or more embodiments of the invention, in which:

FIG. 2 is a cross-sectional side view of a vertical transistor (VFET) with symmetric front and back gates;

FIG. 3 is a cross-sectional side view after disposing a mask on the front gate side;

FIG. 4 is a cross-sectional side view after recessing the interlevel dielectric (ILD) to expose the back gate;

FIG. 5 is a cross-sectional side view after removing the exposed back gate metal;

FIG. 6 is a cross-sectional side view after filling the back gate opening with an insulator;

FIG. 7 is a cross-sectional side view after recessing the insulator;

FIG. 8 is a cross-sectional side view after depositing a back gate dielectric and metal stack;

FIG. 9 is a cross-sectional side view after recessing the back gate stack; and

FIG. 10 is a cross-sectional side view after removing the mask and depositing an ILD.

DETAILED DESCRIPTION

Figure 1:
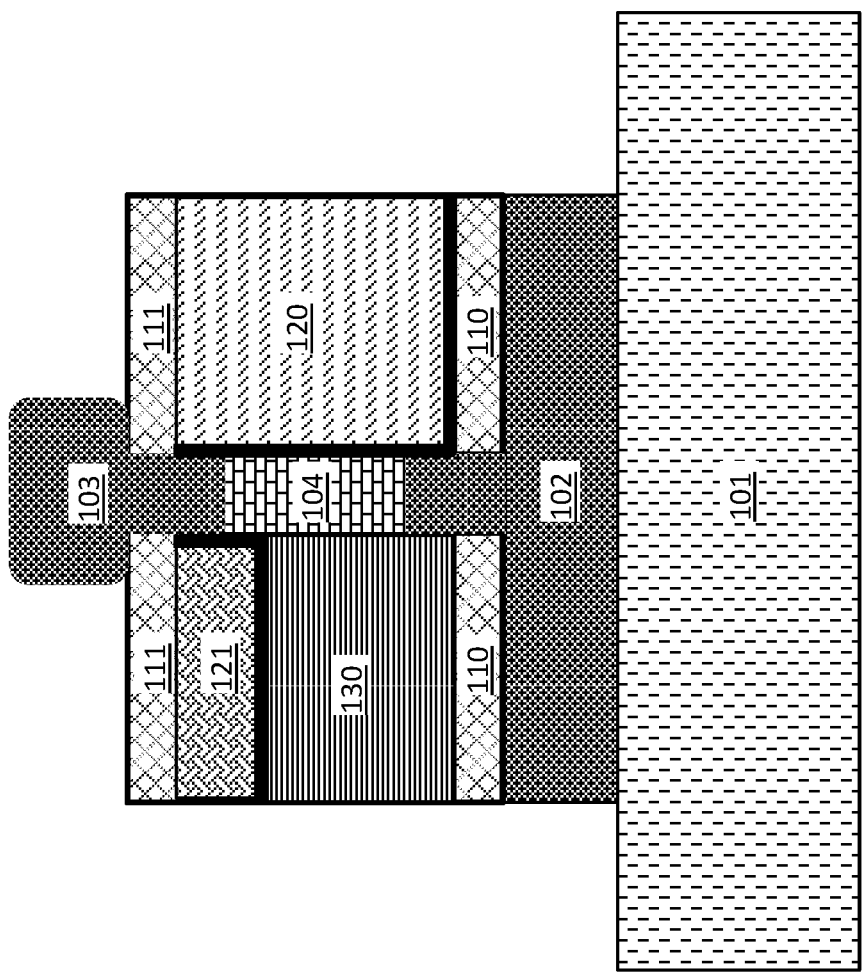
FIG. 1 is a cross-sectional side view of a vertical transistor (VFET) with back bias capability and reduced parasitic capacitance according to one or more embodiments of the invention.

Embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature or characteristic, but every embodiment may or may not include the particular structure or characteristic. Moreover, such phrases are not necessarily referring to the same embodiment. Further, when a particular structure or characteristic is described in connection with an embodiment, it is submitted that it is within the knowledge of one skilled in the art to affect such structure or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

As used herein, the terms "about," "substantially," "approximately," and variations thereof are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to aspects of the present invention, dopant fluctuations affect threshold voltage ($V_t$) control in advanced semiconductor devices, such as static random access memory (SRAM). As semiconductor devices become smaller, $V_t$ control becomes more challenging. One method to increase $V_t$ control is to use back gates, such as found in FinFETs and other double gate transistors, to control Vt in the semiconductor devices.

However, FETs with back bias typically have the back grate overlapping the entire transistor structure, including the source, drain, and channel regions. The large overlap between the back gate and the transistor can create undesired parasitic capacitance. Therefore, there is a need for forming vertical transistors with back bias capability and reduced parasitic capacitance.

Accordingly, described herein are fabrication methods and resulting device structures for vertical transistors with back bias capability and reduced parasitic capacitance. The process flows provide a device in which the back gate is placed only on the source side, instead of across the entire channel. The back gate modulates the barrier height at the source-channel junction, and therefore, the $V_t$ of the vertical transistor. Applying different voltages at the back gate can tune the device characteristics.

Turning now to a detailed description of aspects of the present invention, FIG. 1 is a cross-sectional side view of a vertical transistor (VFET) with back bias capability and reduced parasitic capacitance according to one or more embodiments of the invention. A channel 104 is formed on a substrate 101, flanked by a bottom drain 102 and a top source 103. A front gate 120 includes a bottom spacer 110 and a top spacer 111. A smaller back gate 121 is confined to the source 103 side (top side) of the device, with a thick layer of insulator 130 arranged between the back gate 121 and the bottom spacer 110. The gates of the device are asymmetric, with the back gate 121 only contacting the channel 104 at the source 103 side.

Figure 2:
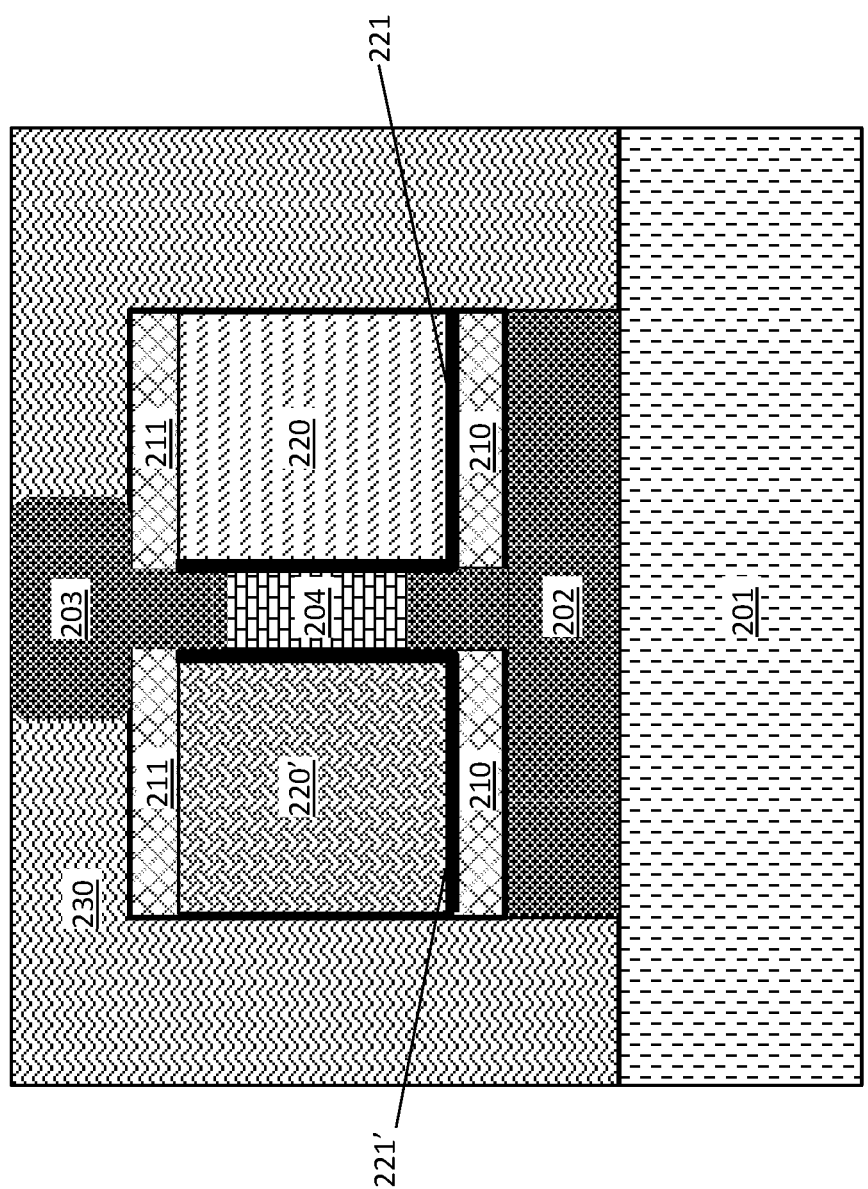

FIGS. 2-10 illustrate exemplary methods of making vertical transistors according to one or more embodiments of the invention. FIG. 2 is a cross-sectional side view of a vertical transistor (VFET) with symmetric front and back gates, which is the starting point for the process flow.

The substrate 201 includes one or more semiconductor materials. Non-limiting examples of suitable substrate 201 materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CaSe (cadmium selenide), CaS (cadmium sulfide), CaTe (cadmium telluride), ZnO (zinc oxide), ZnSe (zinc selenide), ZnS (zinc sulfide), or ZnTe (zinc telluride)), or any combination thereof.

The drain 202 is formed on the substrate 201. The drain 202 is wider than the channel 204 and is arranged beneath the front gate stack 220 and the back gate stack 220'. The drain 202 can be a doped semiconductor layer. The semiconductor material can include, for example, silicon, germanium, or a combination thereof. The drain 202 can be formed by depositing a semiconductor material on the substrate 201 and then doping the semiconductor material layer, or just doping the substrate 202. The dopant can be a p-type dopant (e.g., boron or gallium) or an n-type dopant (e.g., phosphorus, arsenic, antimony). The drain 202 also can be an epitaxial semiconductor layer formed on the substrate 202. The epitaxial semiconductor layer can be formed on the substrate 201 using a suitable growth process, for example, chemical vapor deposition (CVD) (liquid phase (LP) or reduced pressure chemical vapor deposition (RP-CVD), vapor-phase epitaxy (VPE), molecular-beam epitaxy (MBE), liquid-phase epitaxy (LPE), metal organic chemical vapor deposition (MOCVD), or other suitable processes. The epitaxial layer can be, for example, silicon, germanium, or a combination thereof. The drain 202 is a doped semiconductor material. Any suitable techniques, including but not limited to, ion implantation, gas phase doping, plasma doping, plasma immersion ion implantation, cluster doping, infusion doping, liquid phase doping, solid phase doping, in-situ doped epitaxy, or any suitable combination of those techniques, can be used to form the drain 202.

Bottom spacers 210 (first spacers) are formed on the drain 202. The bottom spacers 210 are arranged between the front gate stack 220 and the drain 202, and between the back gate stack 220' and the drain 202. The bottom spacers 210 include an insulating material, for example, silicon dioxide, silicon nitride, SiOCN, or SiBCN. Other non-limiting examples of materials for the bottom spacers 210 include oxides (e.g., silicon oxide), dielectric nitrides (e.g., silicon nitride), dielectric oxynitrides, or any combination thereof. The bottom spacers 210 are initially formed as a layer on the substrate 201 by a deposition process, for example, chemical vapor deposition (CVD) or physical vapor deposition (PVD). In some embodiments, the bottom spacer 210 is formed by a directional deposition (e.g., high density plasma chemical vapor deposition) followed by an etch-back process.

Gate stacks (front gate stack 220 and back gate stack 220') are formed on the bottom spacers 210 on the substrate 101. The front gate stack 220 and back gate stack 220' are symmetric at this stage, arranged on opposing sides of the channel 204 therebetween. The front gate stack 220 and back gate stack 220' include dielectric layers (front gate dielectric layer 221 and back gate dielectric layer 221'). The front gate dielectric layer 221 and the back gate dielectric layer 221' line the edges of the front gate stack 220 and back gate stack 220' along the bottom spacer 210 and channel 204 surfaces.

Front gate dielectric layer 221 and back gate dielectric layer 221' can be dielectric materials having a dielectric constant greater than 3.9, 7.0, or 10.0. Non-limiting examples of suitable materials for dielectric layers include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum. The gate dielectric material 1201 layer can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thicknesses of the dielectric layers vary depending on the deposition process as well as the composition and number of high-k dielectric materials used.

The front gate stack 220 and the back gate stack 220' include a stack of gate metals, including a work function metal disposed on the dielectric layers 221, 221'. The types of work function metals used depend on the type of transistor. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metals are deposited by a suitable deposition process, for example, CVD, PECVD, PVD, plating, thermal or e-beam evaporation, and sputtering.

The front gate stack 220 and back gate stack 220' each include one or more gate metals. The gate metals are conductive gate metals that are deposited over the work function metals to form the gate stacks. Non-limiting examples of suitable conductive metals include aluminum (Al), platinum (Pt), gold (Au), tungsten (W), titanium (Ti), or any combination thereof.

Top spacers 211 (second spacers) are formed on the gate stacks (front gate stack 220 and back gate stack 220'). The top spacers 211 are arranged between the front gate stack 220 and the source 203, and between the back gate stack 220' and the source 203. The top spacers 211 include an insulating material, for example, silicon dioxide, silicon nitride, SiOCN, or SiBCN. Other non-limiting examples of materials for the top spacers 211 include oxides (e.g., silicon oxide), dielectric nitrides (e.g., silicon nitride), dielectric oxynitrides, or any combination thereof. The top spacers 211 are formed as a layer on the gate stacks by a deposition process, for example, chemical vapor deposition (CVD) or physical vapor deposition (PVD).

The channel 204 extends vertically from the drain 202 to the source 203 between the front gate stack 220 and the back gate stack 220'. The channel 204 is a semiconductor layer on the drain 202. In some embodiments, the channel 204 can be formed by using a suitable growth process, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes. In some embodiments, the channel 204 can be formed by first patterning a semiconductor substrate (e.g., to form the fin channel), forming the drain 202 and bottom spacer 210, and then forming the gate. The sources for the channel 204 can be, for example, silicon, germanium, or a combination thereof. The channel 204 includes a p-type dopant (e.g., boron or gallium) or an n-type dopant (e.g., phosphorus or arsenic, or antimony), depending on the type of transistor.

The source 203 is formed on the channel 204. The source 203 also can be an epitaxial semiconductor layer formed on the channel 204. The source 203, like the drain 292, is wider than the channel 204. The source 203 includes doped semiconductor material. The semiconductor material can include, for example, silicon, germanium, or a combination thereof. The source 203 includes a p-type dopant (e.g., boron or gallium) or an n-type dopant (e.g., phosphorus or arsenic), depending on the type of transistor. The source 203 also can be an epitaxial semiconductor layer formed on the channel 204. The epitaxial semiconductor layer can be formed on the channel 204 and top spacers 211 using a suitable growth process, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes. The sources for the epitaxial layer can be, for example, silicon, germanium, or a combination thereof. The source 203 is a doped semiconductor material. Any suitable techniques, including but not limited to, ion implantation, gas phase doping, plasma doping, plasma immersion ion implantation, cluster doping, infusion doping, liquid phase doping, solid phase doping, in-situ doped epitaxy, or any suitable combination of those techniques, can be used to form the source 203.

An interlevel dielectric (ILD) 230 is deposited on the substrate 201 and around the gate stacks (front gate stack 220 and back gate stack 220'). The ILD 230 is arranged on the top spacers 211. The ILD 230 can be formed from, for example, a low-k dielectric material (with k<4.0), including but not limited to, silicon oxide, spin-on-glass, a flowable oxide, a high-density plasma oxide, borophosphosilicate glass (BPSG), or any combination thereof. In some embodiments, a dielectric liner (e.g., silicon nitride, not shown) can be deposited before the deposition of ILD 230. The ILD 230 is deposited by a deposition process, including, but not limited to CVD, PVD, plasma enhanced CVD, atomic layer deposition (ALD), evaporation, chemical solution deposition, spin-on, or like processes.

Figure 3:
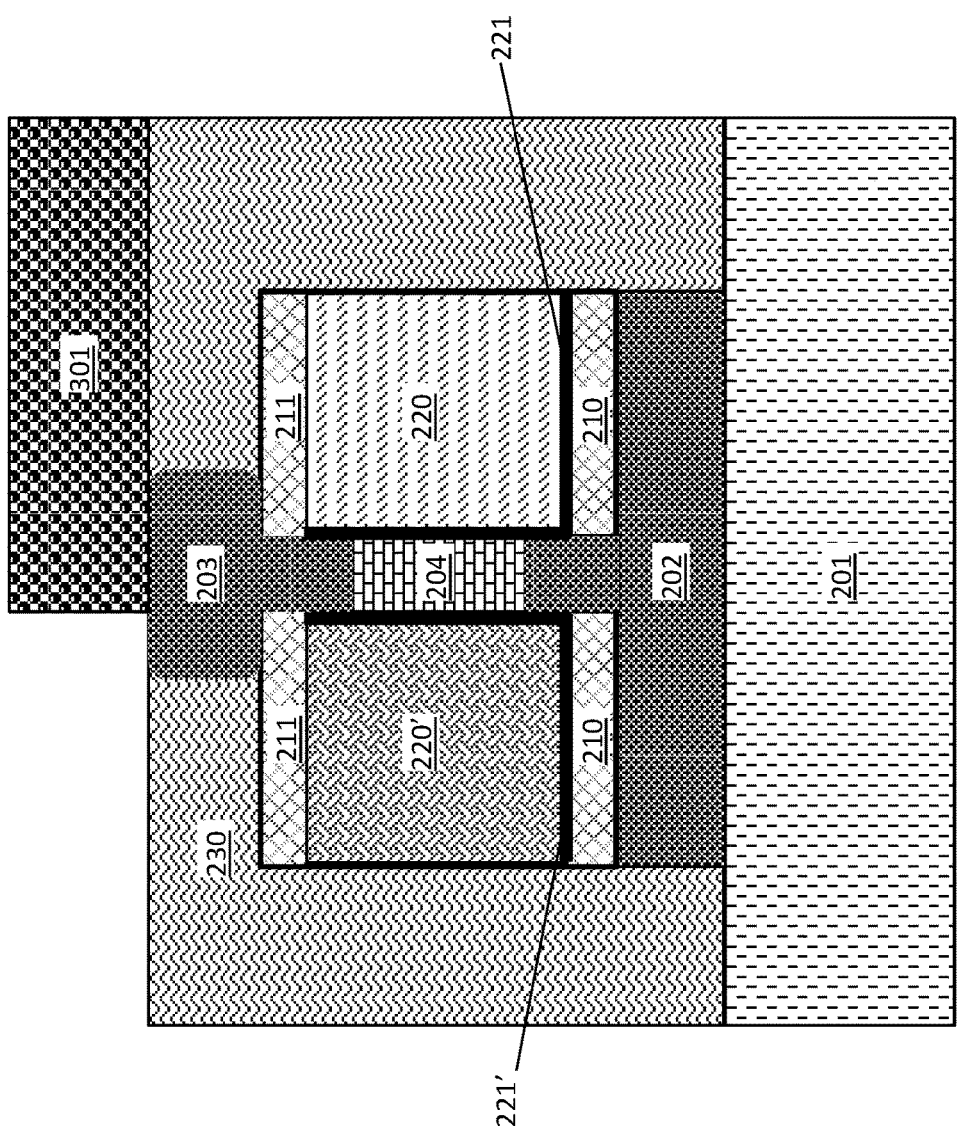

FIG. 3 is a cross-sectional side view after disposing a mask 301 on the front gate side (front gate stack 220 side). The mask 301 covers and protects the front gate side and can be any protective material that is resistant to the etch processes performed in FIGS. 4-9. The mask 301 includes one or more layers. The mask 301 can include a hard mask layer, for example silicon nitride. The mask 301 also can include a planarization layer, for example, an organic planarization layer (OPL) coating or other suitable spin-on coating. The planarization layer also can include an organic material, for example, a polymeric material. The planarization layer can be then patterned to expose the back gate side by disposing an etch mask (not shown) over the planarization layer. The etch mask can be a resist material, for example, a photoresist material. The overlay margin of the mask 301 is defined by the width of the source 203, which is wider than the channel 204.

Figure 4:
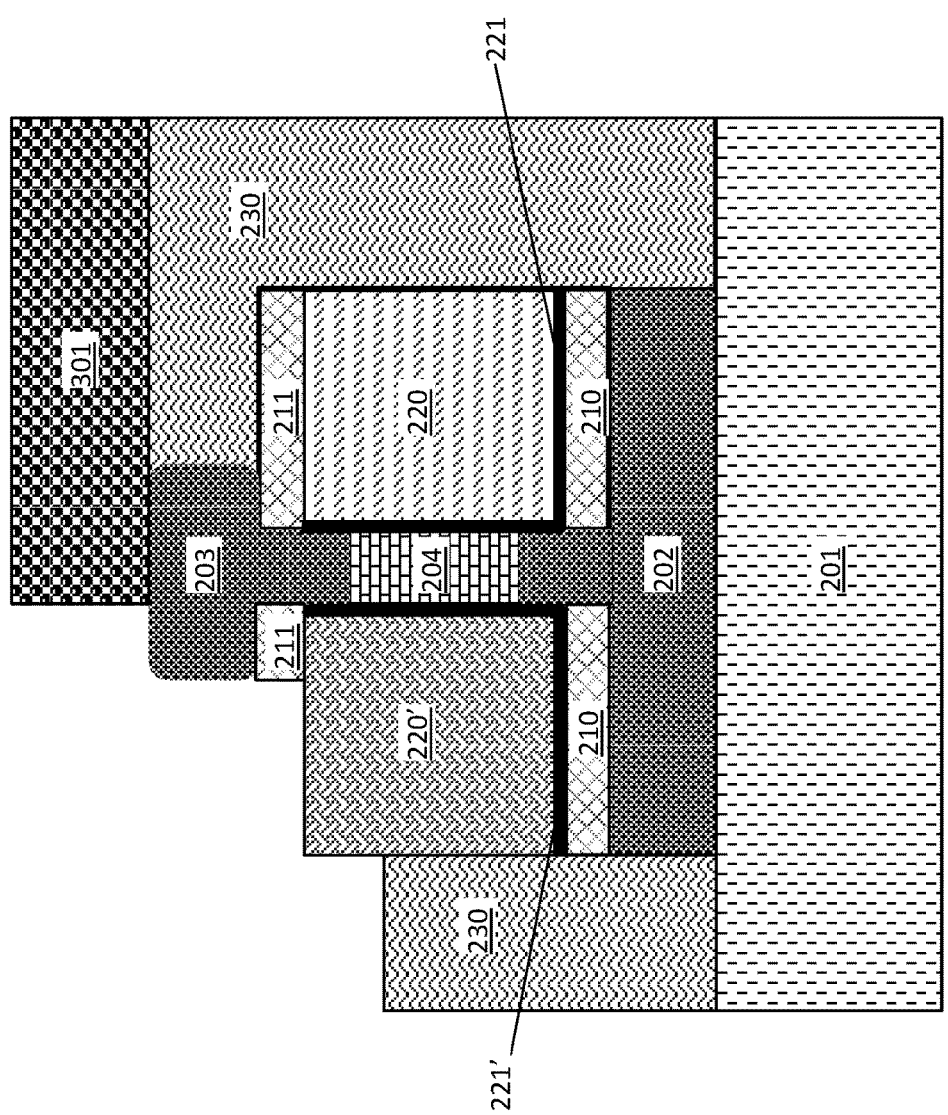

FIG. 4 is a cross-sectional side view after recessing the ILD 230 to expose the back gate stack 220'. One or more etch processes are performed to remove portions of the ILD 230 and top spacer 211 over the back gate stack 220'. The one or more etch processes dielectric etch processes that are selective to (do not etch) the metals (of the back gate stack 220') and semiconductor materials (of the source 203). The ILD 230 is etched to a level below the back gate stack 220', exposing the side of the back gate stack 220'. A portion of the top spacer 221 is removed to expose the top of the back gate stack 220'. A portion of the top spacer 221 can remain beneath the source 203. The one or more etch processes used to recess the ILD 230 and the top spacer 211 can be, for example, a plasma etch, a reactive ion etch (ME), a wet etch, or any suitable combination of those techniques. In some embodiments, the ILD 230 is recessed by a ME.

Figure 5:
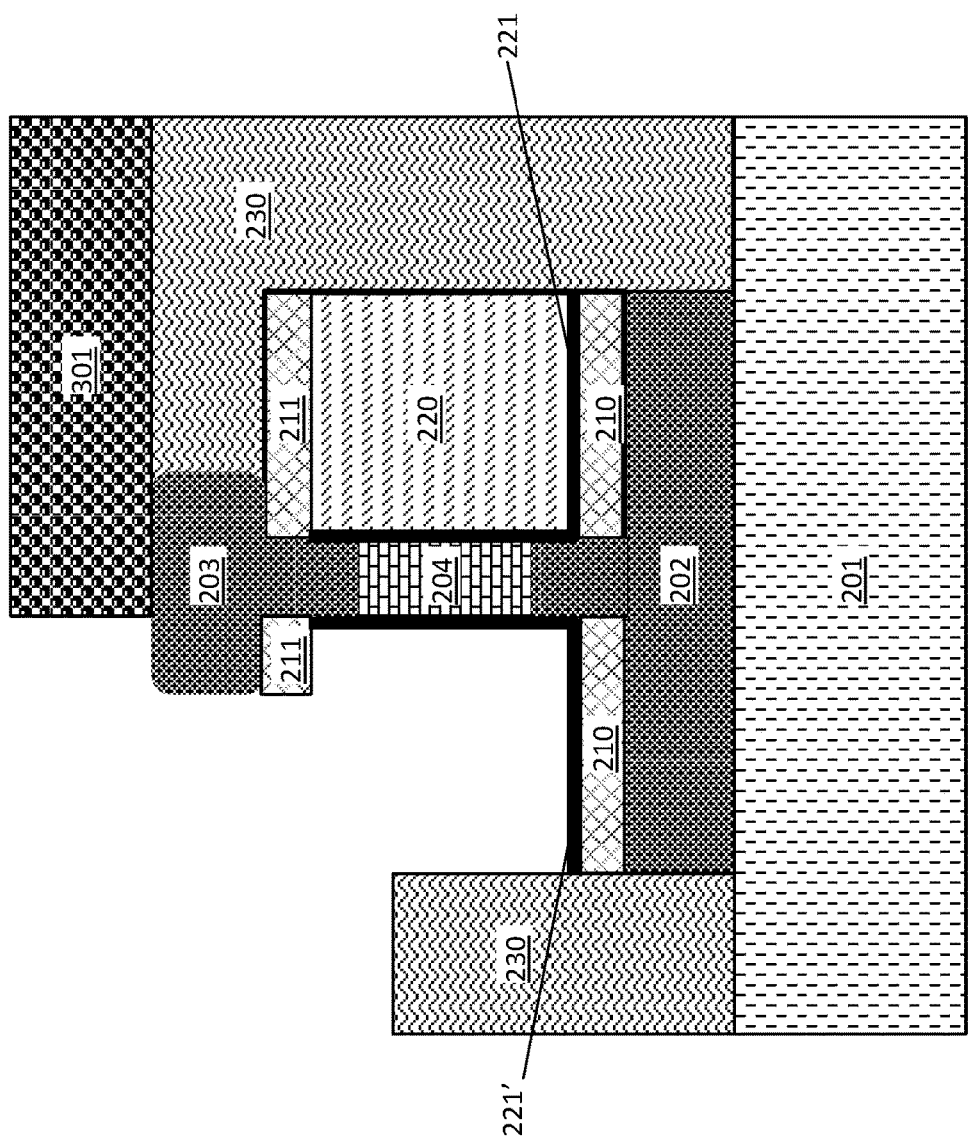

FIG. 5 is a cross-sectional side view after removing the exposed back gate stack 220'. The dielectric layer 221' is exposed. One or more etch processes are performed to remove the back gate stack 220'. The one or more etch processes are selective to (do not etch) dielectric materials (dielectric layer 221' and ILD 230) and semiconductor materials (source 203). The one or more etch processes used to remove the back gate stack 220' can be, for example, a plasma etch, a ME, a wet etch, or any suitable combination of those techniques. In some embodiment, the back gate stack 220' is etched by a directional RIE process followed by an isotropic etch process. For example, when the back gate stack 220' comprises tungsten and titanium nitride (TiN), tungsten can be etched by $SF_6$, $CF_4$, $CBF_3$, and or $CHF_3$ mixed with oxygen. TiN can is etched by a wet etch process comprising ammonia and hydroperoxide.

Optionally, the exposed gate dielectric layer 221' can be removed. In other words, the exposed gate dielectric layer 221' can be kept or removed. Some embodiments include removing the back gate conductor only and keeping the original gate dielectric layer 221', and then later forming the new back gate only on the source side. Only the conductor is deposited next to the original back gate dielectric layer. Alternatively, a conductor and a new gate dielectric layer are deposited on top of the original gate dielectric. In other embodiments, both the original back gate conductor and gate dielectric are removed, and then the new back gate is formed only on the source side. In these embodiments, both the new back gate dielectric and new back gate conductor are deposited. When the gate dielectric comprise hafnium oxide, it can be removed by a wet etch comprising diluted hydrofluoric acid and hydrochloride acid.

Figure 6:
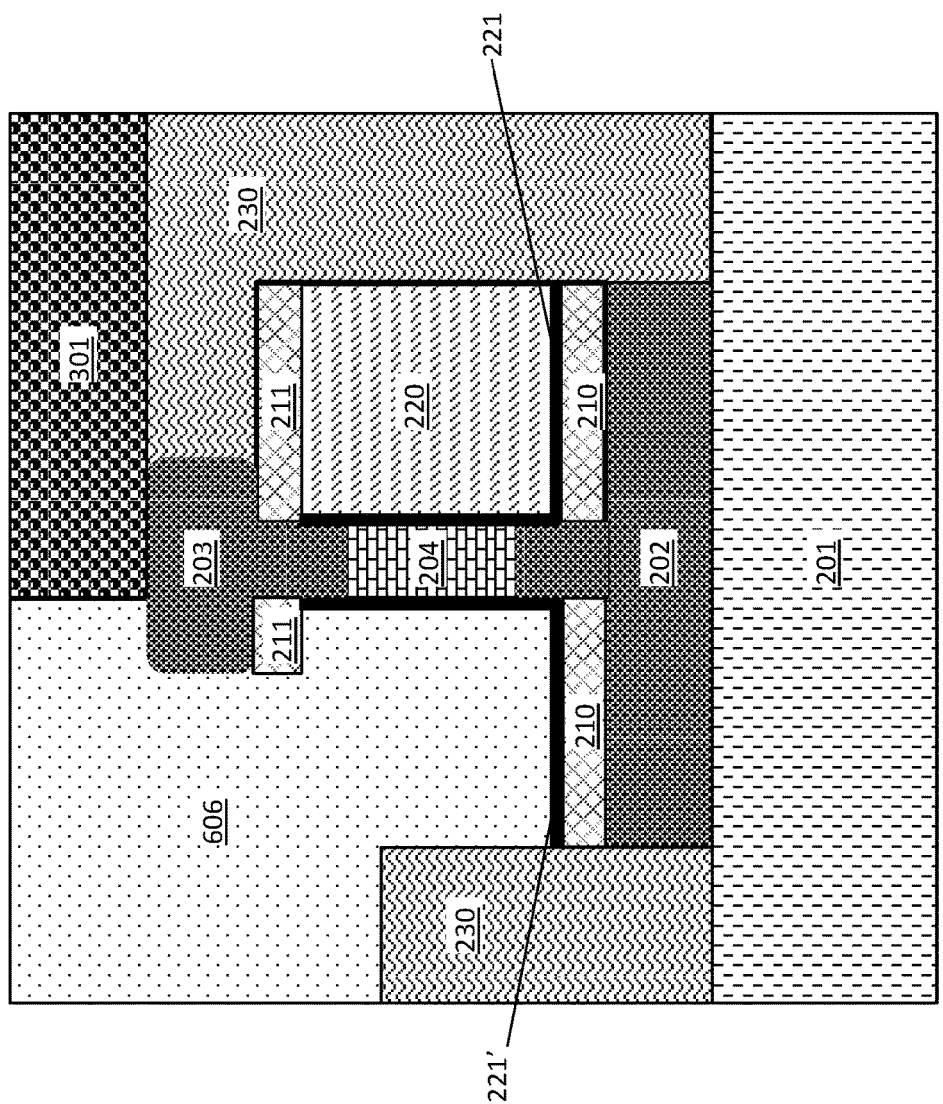

FIG. 6 is a cross-sectional side view after filling the back gate stack opening with an insulator 606. The insulator 606 is disposed directly on the dielectric layer 221' and extends over the ILD 230 and the source 203. Non-limiting examples of insulating materials include, for example, nitrides (e.g., silicon nitride), oxides (e.g., flowable oxides, silicon oxide, aluminum oxide), or a combination thereof. The insulator 606 can be formed using a suitable deposition process, including, but not limited to CVD, PVD, plasma enhanced CVD, atomic layer deposition (ALD), evaporation, chemical solution deposition, or like processes. The insulator 606 is planarized by, for example, CMP.

Figure 7:
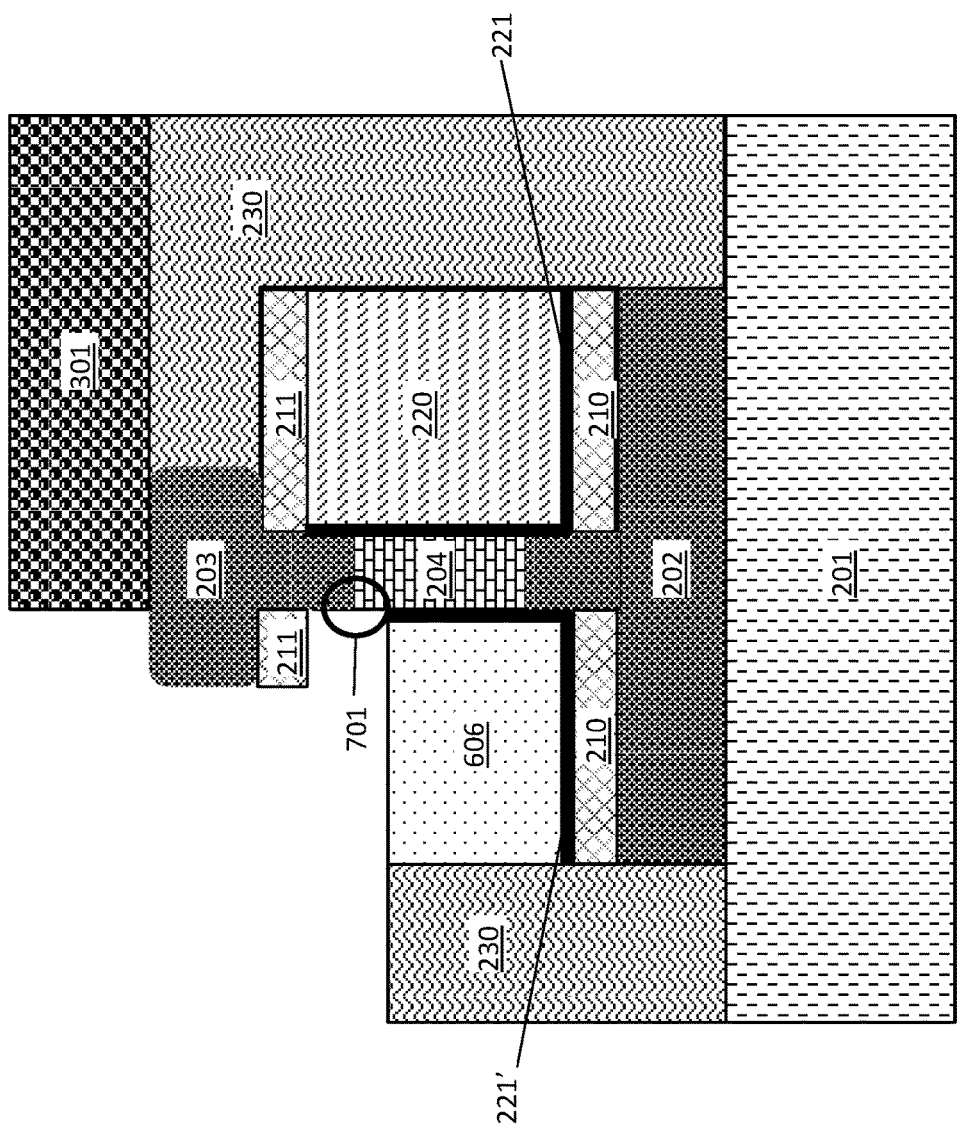

FIG. 7 is a cross-sectional side view after recessing the insulator 606. The insulator 606 is recessed to a level that exposes the junction 701 between the channel 204 and the source 203 (source-channel junction). The insulator 606 is recessed to a level below the channel 204. Although the insulator 606 is shown as being recessed to about the same level as the ILD 230, the insulator 606 can be recessed a level that is different from the ILD 230, provided that the junction 701 is exposed. Also, although insulator 606 is shown as being recessed to a flat layer, insulator 606 does not have to be flat after recessing. The insulator 606 can be recessed by one or more etch processes, for example, by a 2-step etch process. In an exemplary embodiment, a first etch process includes a directional etch by ME, and a second etch process includes an isotropic etch, such as hydrofluoric acid wet etching, or a chemical oxide removal dry etching. After recessing the insulator 606, optionally, the original back gate dielectric is removed (as shown). Alternatively, the original back gate dielectric is not removed.

The thick layer of the recessed insulator 606 remaining on the bottom spacer 210 provides a surface to deposit the back gate metals (described in FIG. 8 below). The thickness of the recessed insulator 606 generally varies. In one or more embodiments, the thickness of the recessed insulator 606 (remaining insulator 606 after recessing) is at least 10 nanometers (nm). In other embodiments, the thickness of the recessed insulator 606 is in a range from about 10 to about 100 nm.

The portion of the dielectric layer 221' along the channel 204 at the junction 701 is optionally removed, as shown in FIG. 7. Although in other embodiments (not shown), the dielectric layer 221' does not have to be removed. Only the insulator 606 needs to be removed to a level that exposes the junction 701.

Figure 8:
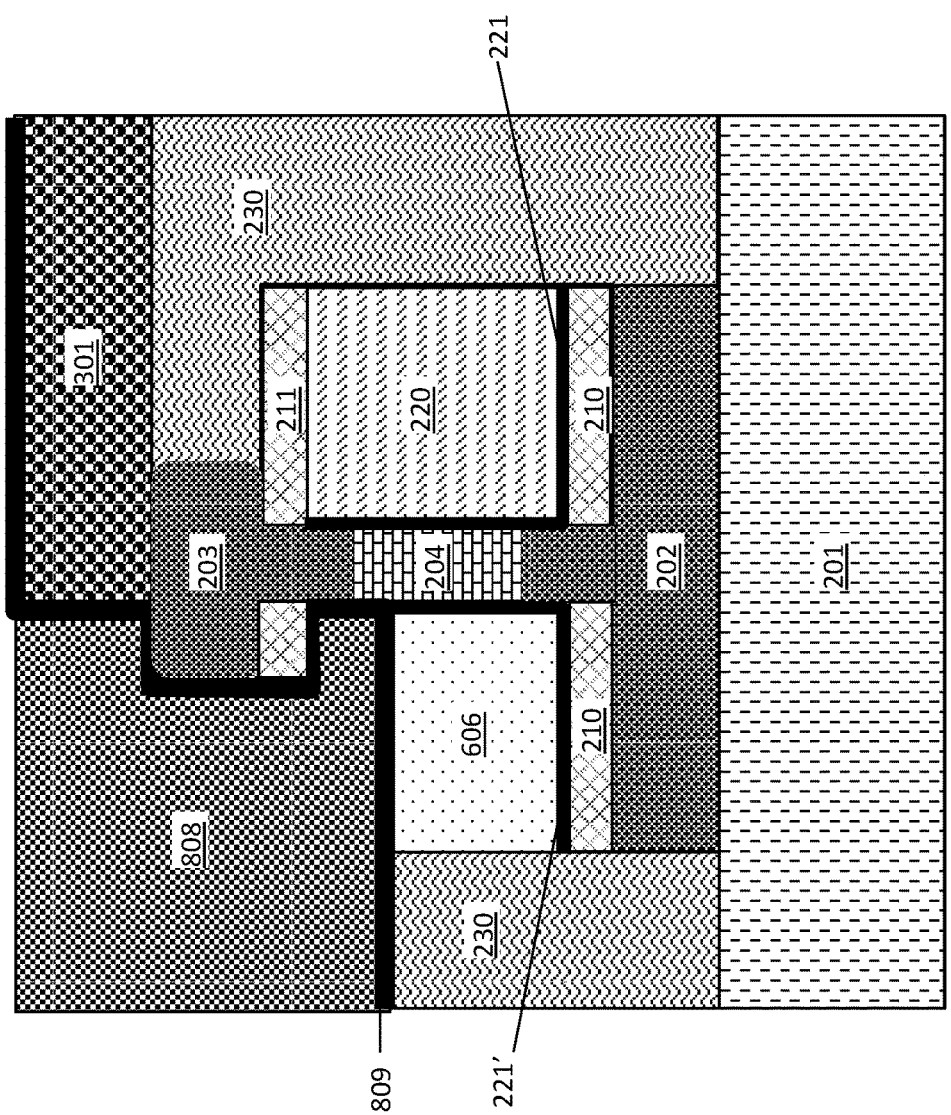

FIG. 8 is a cross-sectional side view after depositing a back gate dielectric layer 809 and back gate stack 808. The back gate dielectric layer 809 is deposited before the back gate stack 808. The back gate dielectric layer 809 is optional if we keep the original back gate dielectric. The back gate dielectric layer 809 is deposited directly on the insulator 606, on the ILD 230, and lines the channel 204 (or on top of the original gate dielectric if it is not removed), top spacer 211, and source 203. The dielectric layer 809 can be the same or different from the dielectric layer 221'. The dielectric layer 809 also can have a thickness that is the same or different from the dielectric layer 221'. In embodiments in which the dielectric layer 221' is not removed from the junction 701 (see FIG. 7), the dielectric layer 809 is then deposited on top of dielectric layer 221' that lines the channel 204 and the source 203.

The dielectric layer 809 can be dielectric materials having a dielectric constant greater than 3.9, 7.0, or 10.0. Non-limiting examples of suitable materials for the dielectric layer 809 includes oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum. The dielectric layer 809 can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes.

The back gate stack 808 is deposited on the dielectric layer 809. The back gate stack 808 can be the same or different from the starting back gate stack 220' (see FIG. 2). The back gate stack 808 includes a stack of gate metals, including a work function metal disposed on the dielectric layer 809 and a conductive gate metal. The types of work function metal used depend on the type of transistor. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metals are deposited by a suitable deposition process, for example, CVD, PECVD, PVD, plating, thermal or e-beam evaporation, and sputtering.

The back gate stack 808 includes a conductive gate metal deposited over the work function metal. Non-limiting examples of suitable conductive metals include aluminum (Al), platinum (Pt), gold (Au), tungsten (W), titanium (Ti), or any combination thereof. The conductive metal is deposited by a suitable deposition process, for example, CVD, PECVD, PVD, plating, thermal or e-beam evaporation, and sputtering. A planarization process, for example, chemical mechanical planarization (CMP), is performed to polish the surface of the metals to form the back gate stack 808.

Figure 9:
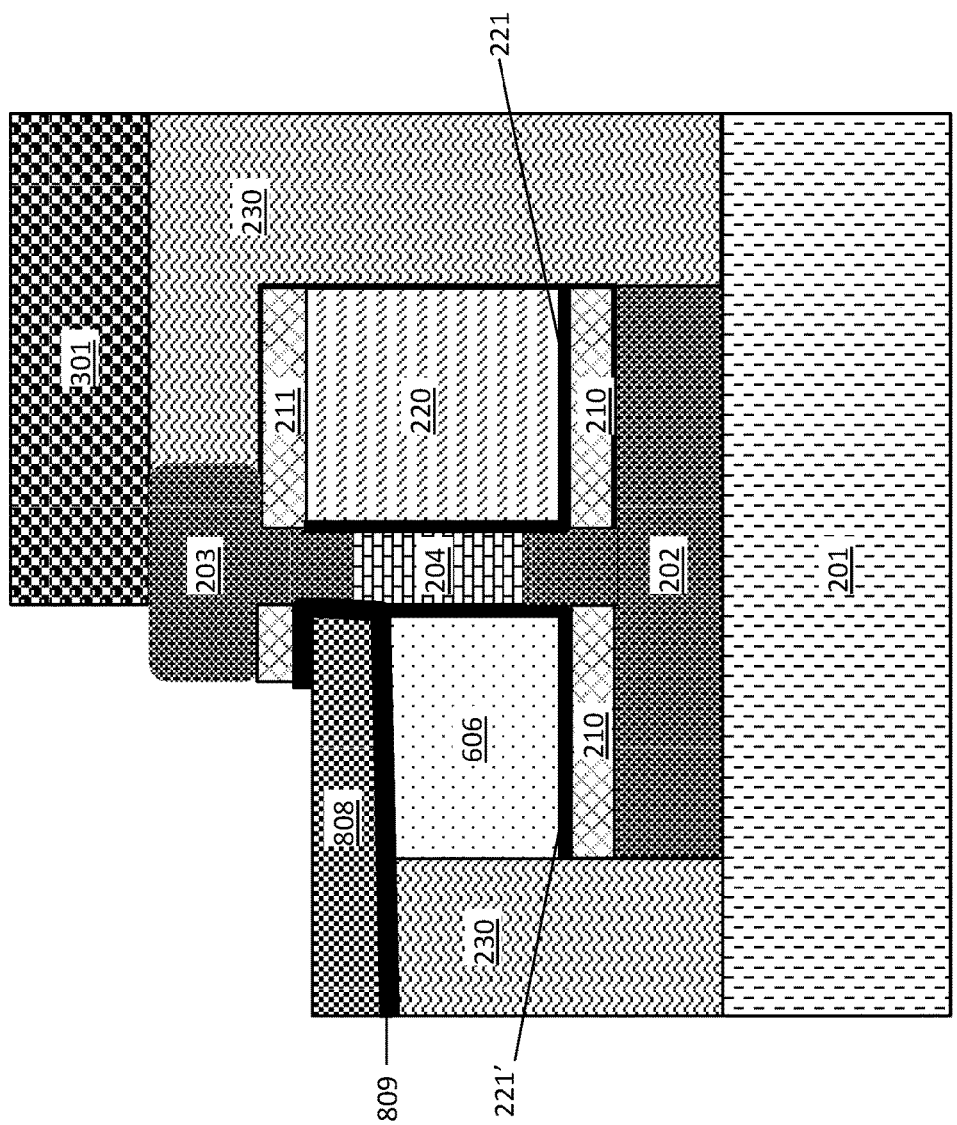

FIG. 9 is a cross-sectional side view after recessing the back gate stack 808 and the dielectric layer 809. The back gate stack 808 and dielectric layer 809 are recessed to a level below the top spacer 211. The top spacer is arranged on the back gate stack 808 but is shorter than the top spacer 211 arranged on the front gate stack 220'. The back gate stack 808 extends from the insulator 606 to the top spacer 211. The back gate stack 808 is thinner than the front gate stack 220. The back gate stack 808 and dielectric layer 809 are recessed by one or more etch processes, for example, a plasma etch, RIE, a wet etch, or any suitable combination of those techniques. In some embodiments, the back gate stack 220' is etched by a directional RIE process followed by an isotropic etch process. For example, when the back gate stack 220' includes tungsten and titanium nitride (TiN), tungsten can be etched by $SF_6$, $CF_4$, $CBF_3$, and or $CHF_3$ mixed with oxygen. TiN can is etched by a wet etch process including ammonia and hydroperoxide.

Figure 10:
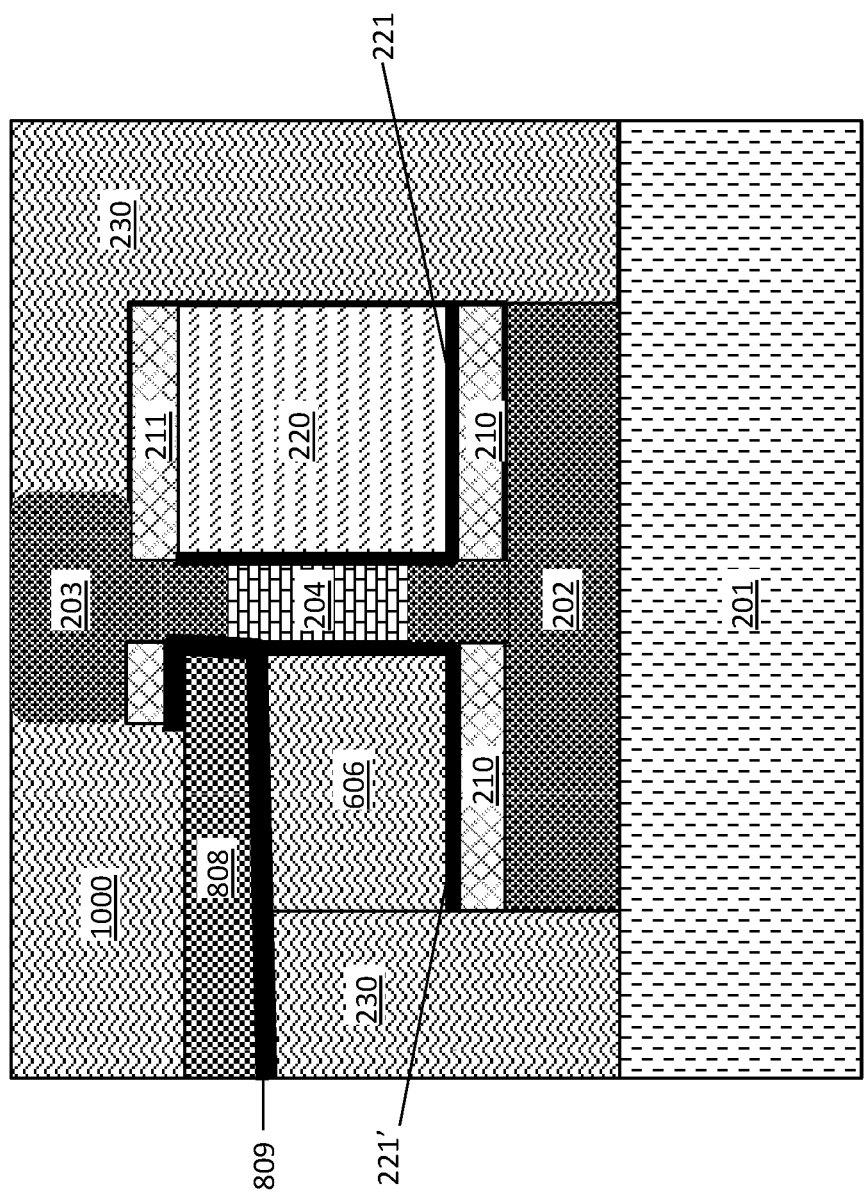

FIG. 10 is a cross-sectional side view after removing the mask 301 over the front gate side and depositing an ILD 1000 on the back gate stack 808. The ILD 1000 can be the same or different from the ILD 230. The ILD 1000 can be formed from, for example, a low-k dielectric material (with k<4.0), including but not limited to, silicon oxide, spin-on-glass, a flowable oxide, a high-density plasma oxide, borophosphosilicate glass (BPSG), or any combination thereof. The ILD 1000 is deposited by a deposition process, including, but not limited to CVD, PVD, plasma enhanced CVD, atomic layer deposition (ALD), evaporation, chemical solution deposition, or like processes.

As shown in the asymmetric device of FIG. 10, the back gate stack 808 and the front gate stack 220 are different, having different thicknesses, and optionally, different metals. The back gate is thinner and confined to the source 203 side of the device, as the back gate stack 808 is arranged on a thick layer of insulator 606. The layer of insulator 606 is thicker than the back gate stack 808 in some embodiments. The back gate stack 808 has a thickness that is smaller than a thickness of the front gate stack 220. The front gate stack 220 contacts the drain 202, channel 204, and source 203. However, the back gate stack 808 is confined to the source 203 side, instead of across the entire channel 204. Because of the differences in the gates, different voltages can be applied to the back gate, compared to the front gate, to tune the device characteristics.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of making a vertical transistor device, the method comprising:

forming a front gate and a back gate opposite a major surface of a substrate, the front gate and the back gate being symmetric and arranged on opposing sides of a channel between the front gate and the back gate, the channel extending from a drain to a source;

forming a mask to cover the front gate;

removing the back gate; and replacing the back gate with a layer of insulator and another back gate stack, the another back gate stack only covering a junction between the channel and the source, and remaining portions of the back gate being the layer of insulator.

2. The method of claim 1, wherein the source is wider than the channel.

3. The method of claim 1, wherein the drain is wider than the channel.

4. The method of claim 1, wherein the back gate further comprises a top spacer, and a portion of the top spacer is also removed during removing the back gate.

5. The method of claim 4, wherein a portion of the top spacer remains beneath the source when the portion of the top spacer is also removed.

6. The method of claim 1, wherein the layer of insulator comprises an oxide.

7. The method of claim 1 further comprising depositing a gate dielectric layer on the layer of insulator before depositing the back gate stack.

8. The method of claim 7, wherein the gate dielectric layer is arranged on the layer of insulator and lines surfaces of the channel, the source, and the top spacer.

9. A method of making a vertical transistor device, the method comprising:

forming a front gate and a back gate on a substrate, the front gate and the back gate being symmetric and arranged on opposing sides of a channel between the front gate and the back gate, the channel extending vertically from a drain to a source, a bottom spacer arranged between the front gate and the drain and between the back gate and the drain, a top spacer arranged between the front gate and the source and the back gate and the source, and an interlevel dielectric (ILD) deposited on the front gate and the back gate;

forming a mask to cover the front gate;

recessing the ILD to expose the back gate;

removing the back gate and a portion of the top spacer;

depositing a layer of insulator in the opening formed where the back gate was removed;

recessing the layer of insulator;

depositing a back gate stack on the layer of insulator; and recessing the back gate stack such that the back gate stack extends from the layer of insulator to the top spacer.

10. The method of claim 9, wherein recessing the layer of insulator exposes a source-drain junction.

11. The method of claim 9, wherein the layer of insulator is recessed to a level below the channel.

12. The method of claim 9, wherein the back gate includes a gate dielectric layer, and the gate dielectric layer is not removed during removing the back gate.

13. The method of claim 12, wherein the back gate stack deposited on the layer of insulator is deposited directly on the gate dielectric layer.

14. The method of claim 12 further comprising depositing another gate dielectric on the gate dielectric layer before depositing the back gate stack.

15. The method of claim 9, wherein the back gate includes a gate dielectric layer, and the gate dielectric layer is also removed during removing the back gate.

16. The method of claim 15 further comprising depositing another gate dielectric layer before depositing the back gate stack.

17. The method of claim 9 further comprising depositing an ILD on the back gate stack after recessing the back gate stack.

* * * * *